United States Patent [19]
Harshfield

[11] Patent Number: 5,869,843
[45] Date of Patent: Feb. 9, 1999

[54] MEMORY ARRAY HAVING A MULTI-STATE ELEMENT AND METHOD FOR FORMING SUCH ARRAY OR CELLS THEREOF

[75] Inventor: Steven T. Harshfield, Emmett, Id.

[73] Assignee: Micron Technology, Inc., Boise, Id.

[21] Appl. No.: 486,639

[22] Filed: Jun. 7, 1995

[51] Int. Cl.$^6$ .................................................. H01L 45/00
[52] U.S. Cl. ......................... 257/5; 257/2; 257/3; 257/4
[58] Field of Search .................................... 257/5, 2, 3, 4

[56] References Cited

U.S. PATENT DOCUMENTS

| | | | |
|---|---|---|---|
| 3,423,646 | 1/1969 | Cubert et al. ............................. | 317/234 |
| 3,796,926 | 3/1974 | Cole et al. ............................. | 317/234 R |
| 4,099,260 | 7/1978 | Lynes et al. ............................. | 365/105 |
| 4,115,872 | 9/1978 | Bluhm ..................................... | 365/163 |
| 4,174,521 | 11/1979 | Neale ....................................... | 357/45 |
| 4,194,283 | 3/1980 | Hoffmann ................................ | 29/571 |
| 4,203,123 | 5/1980 | Shanks ..................................... | 357/2 |
| 4,227,297 | 10/1980 | Angerstein ............................. | 29/571 |
| 4,272,562 | 6/1981 | Wood ....................................... | 427/87 |
| 4,458,260 | 7/1984 | McIntyre et al. ........................ | 357/30 |
| 4,502,208 | 3/1985 | McPherson ............................. | 29/584 |
| 4,569,698 | 2/1986 | Feist ........................................ | 148/1.5 |
| 4,677,742 | 7/1987 | Johnson . | |
| 4,757,359 | 7/1988 | Chiao et al. ............................. | 357/23.5 |
| 4,804,490 | 2/1989 | Pryor et al. ...................... | 252/62.3 BT |
| 4,809,044 | 2/1989 | Pryor et al. ............................. | 357/2 |
| 4,823,181 | 4/1989 | Mohsen et al. ......................... | 357/51 |
| 4,876,220 | 10/1989 | Mohsen et al. ......................... | 437/170 |
| 4,876,668 | 10/1989 | Thakoor et al. ........................ | 365/163 |
| 4,881,114 | 11/1989 | Mohsen et al. ......................... | 357/54 |
| 4,892,840 | 1/1990 | Esquivel et al. ........................ | 437/52 |
| 5,144,404 | 9/1992 | Iranmanesh et al. .................... | 357/51 |
| 5,166,096 | 11/1992 | Cote et al. .............................. | 437/195 |
| 5,166,758 | 11/1992 | Ovshinsky et al. ..................... | 257/3 |
| 5,177,567 | 1/1993 | Klersy et al. ............................ | 257/4 |
| 5,293,335 | 3/1994 | Pernisz et al. . | |
| 5,296,716 | 3/1994 | Ovshinsky et al. ..................... | 257/3 |
| 5,335,219 | 8/1994 | Ovshinsky et al. ..................... | 369/288 |
| 5,341,328 | 8/1994 | Ovshinsky et al. ..................... | 365/163 |
| 5,359,205 | 10/1994 | Ovshinsky ............................... | 257/3 |
| 5,363,329 | 11/1994 | Troyan . | |
| 5,510,629 | 4/1996 | Karpovich et al. ..................... | 257/50 |
| 5,534,711 | 7/1996 | Ovshinsky et al. ..................... | 257/3 |

FOREIGN PATENT DOCUMENTS

| | | | |
|---|---|---|---|
| 0 117 045 | 8/1984 | European Pat. Off. ........ | H01L 45/00 |
| 1 319 388 | 6/1973 | Germany ......................... | H01L 9/00 |
| 60-109266 | 6/1985 | Japan ............................... | H01L 27/10 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

(List continued on next page.)

*Primary Examiner*—Caridad Everhart
*Attorney, Agent, or Firm*—Fletcher, Yoder & Van Someren

[57] ABSTRACT

A memory device having a plurality of memory arrays. Each array has a plurality of memory cells, each memory cell including an electrode defining a respective contact area. Each memory array is formed by depositing a continuous chalcogenide layer. This chalcogenide layer, even when continuous, will have active areas formed above the electrodes, and a conductive layer electrically coupling at least a portion of the active areas. The memory array can also include a dielectric volume surrounding at least a portion of the plurality of electrodes. The electrodes can be contacts, plugs or pillars deposited in etched openings in the dielectric volume.

21 Claims, 4 Drawing Sheets

OTHER PUBLICATIONS

Post et al., "Polysilicon Emitters for Bipolar Transistors: A Review and Re–Evaluation of Theory and Experiment," *IEEE,* 39(7):1717–1731, 1992.

Post and Ashburn, "The Use of an Interface Anneal to Control the Base Current and Emitter Resistance of p–n–p Polysilicon Emitter Bipolar Transistors," *IEEE,* 13(8):408–410, 1992.

Rose et al., "Amorphous Silicon Analogue Memory Devices," *J. Non–Crystalline Solids,* 115:168–170, 1989.

Yamamoto et al., "The I–V Characteristics of Polycrystalline Silicon Diodes and the Energy Distribution of Traps in Grain Boundaries," *Electronics and Communications in Japan,* Part 2, 75(7):51–58, 1992.

Yamamoto et al., "The I–V Charactistics of Polycrystalline Silicon Diodes and and Energy Distribution of Traps in Grain Boundaries," *Electronics and Communications in Japan,* Part 2, 75(7):51–58, 1992.

Yeh et al., "Investigation of Thermal Coefficient for Polycrystalline Silicon Thermal Sensor Diode," *Jpn. J. Appl. Phys.,* 31(Part 1, No. 2A):151–155, 1992.

Oakley et al., "Pillars—The Way to Two Micron Pitch Multilevel Metallisation," *IEEE,* 23–29, 1984.

MEMORY ARRAY HAVING A MULTI-STATE ELEMENT AND METHOD FOR FORMING SUCH ARRAY OR CELLS THEREOF

BACKGROUND OF THE INVENTION

The present invention relates generally to the use of chalcogenide materials in semiconductor devices, and more particularly relates to a method for forming a chalcogenide memory layer for non-volatile memory integrated circuits and to memory arrays including multi-state materials therein.

Generally, chalcogenides are multi-state materials, that is, materials which may be electrically stimulated to change states, from an amorphous state to a crystalline state, for example, or to exhibit different resistivities while in the crystalline state. Thus, chalcogenide elements may be utilized, for example, as memory cells in a random access memory (RAM) integrated circuit (IC) to store binary data, or data represented in higher-based systems. Such memory cells will typically include a cell accessible, for example, by a potential applied to digit lines, in a manner conventionally utilized in memory devices. Typically, the cell will include the chalcogenide element as a resistive element, and will include an access or isolation device coupled to the chalcogenide element. In one exemplary implementation suitable for use in a RAM, the access device may be a diode.

Many chalcogenide alloys may be contemplated for use with the present invention. For example, alloys of tellurium, antimony and germanium may be particularly desirable, and alloys having from approximately to 55–85 percent tellurium and on the order of 15–25 percent germanium, are contemplated for use in accordance with the present invention. Preferably, the chalcogenide element will be generally homogeneous (although gradiented alloys may be utilized), and will be alloys formed from tellurium, selenium, germanium, antimony, bismuth, lead, strontium, arsenic, sulfur, silicon, phosphorus, oxygen and mixtures or alloys of such elements. The alloys will be selected so as to establish a material capable of assuming multiple, generally stable, states in response to a stimulus. It is contemplated that in most cases, the stimulus will represent an electrical signal, and that the multiple states will be states of differing electrical resistance. U.S. Pat. No. 5,335,219 is believed to be generally illustrative of the existing state of the art relative to chalcogenide materials, and is believed to provide explanations regarding the current theory of function and operation of chalcogenide elements and their use in memory cells. The specification of U.S. Pat. No. 5,335,219 to Ovshinski et al., issued Aug. 2, 1994, is incorporated herein by reference, for all purposes. An exemplary specific chalcogenide alloy suitable for use in the present invention is one consisting of $Te_{56}Ge_{22}Sb_{22}$.

A cell as generally described above can include electrodes which contact the chalcogenide resistive element. At least one of these electrodes may be one of the identified digit lines, or may be an intermediate conductor. Such a cell will also have a chalcogenide "active area", that is, an area of the chalcogenide element which can be programmed to have different resistivity values. The larger the active area, the more current and the more time is necessary to program the memory cell.

In existing devices where chalcogenide materials are used in memory devices, the chalcogenide elements are small and discrete elements, each physically and electrically isolated from each other. Creating a plurality of separate chalcogenide islands has necessitated additional and precise etching and masking steps. Furthermore, it has required prolonged exposure of unprotected chalcogenide during manufacturing.

Chalcogenide materials are very susceptible to damage by most present silicon semiconductor processing techniques. Silicon processing can require temperatures that liquify chalcogenides, thus destroying them as process-worthy materials. However, chalcogenides are compatible with metalization and passivation processes. In part, this is due to the fact that these processes are performed at lower temperatures; typically below 350° C. Additionally, chalcogenide materials are very easily contaminated. Direct contact between silicon and chalcogenide can "poison" both materials, rendering each inoperable. For this reason, isolation barriers, or diffusion barriers, must often be included to prevent undesirable contamination of the chalcogenide material.

Techniques for forming a chalcogenide memory cell have included the establishing of a chalcogenide electrode with an insulation layer thereon. A hole is then formed in the insulation layer, forming an access port. The chalcogenide layer has then been deposited, establishing electrical communication through the hole. Conventional techniques of forming the hole and the insulation layer have included the application of a high current pulse to open a hole having a diameter on the order of 0.1–0.2 microns. Additional attempts have been made to rely upon photolithography to establish an opening through the insulation layer.

Accordingly, the present invention provides new methods for forming a chalcogenide memory array having a continuous chalcogenide layer extending across a plurality of cells. The methods and apparatus of the present invention prevent damage to the chalcogenide layer and provide higher manufacturing efficiency by reducing the number of masking and etching steps. Additionally, chalcogenide cells manufactured in accordance with the present invention may provide a plurality of high-density memory cells with small and discrete active areas.

SUMMARY OF THE INVENTION

The present invention comprises a novel memory device including a plurality of memory arrays, each memory array having a plurality of memory cells. The memory cells can be arranged in trenches formed by dielectric materials or can be part of memory array patterns. Each memory cell has a multi-state element formed as an active area of a generally continuous layer of a selected multi-state material, preferably a chalcogenide material. The multi-state material layer extends across a plurality of said memory cells.

A method of manufacturing the multi-state element assemblies includes the steps of first providing one or more electrodes placed at selected locations within an array area in a base structure. The base structure generally includes an underlayer, having a plurality of access devices, and a dielectric material volume covering the underlayer. In one exemplary embodiment, an electrode material layer is placed between the underlayer and the dielectric volume. The electrodes in this layer couple to a corresponding access device and can be placed within the dielectric layer by lithography or as plugs or pillars placed by chemical vapor deposition inside of openings or trenches etched into the dielectric volume.

The next step includes applying the multi-state material layer over the array area, preferably using a sputtering technique. The areas of the multi-state material layer in proximate contact with the electrodes become active areas that can act as non-volatile resistive memory elements. A first conductive layer is then applied over at least a portion of the multi-state material layer. The first conductive layer can serve as a diffusion barrier and/or may be a conductive buss electrically coupling a number of active areas.

A second conductive layer can then be applied over at least a portion of the first conductive layer. The second conductive layer can again electrically couple a plurality of active areas.

In an alternative preferred method of manufacture, rather than using the dielectric volume to form trenches or patterns, the multi-state material layer is applied directly over a generally flat array area of a base structure. A continuous electrode material layer is immediately applied over the multi-state material layer, thereby creating a multi-layer stack. The whole multi-layer stack is then etched into memory array patterns.

DESCRIPTION OF THE PREFERRED EMBODIMENTS

Figure 1:
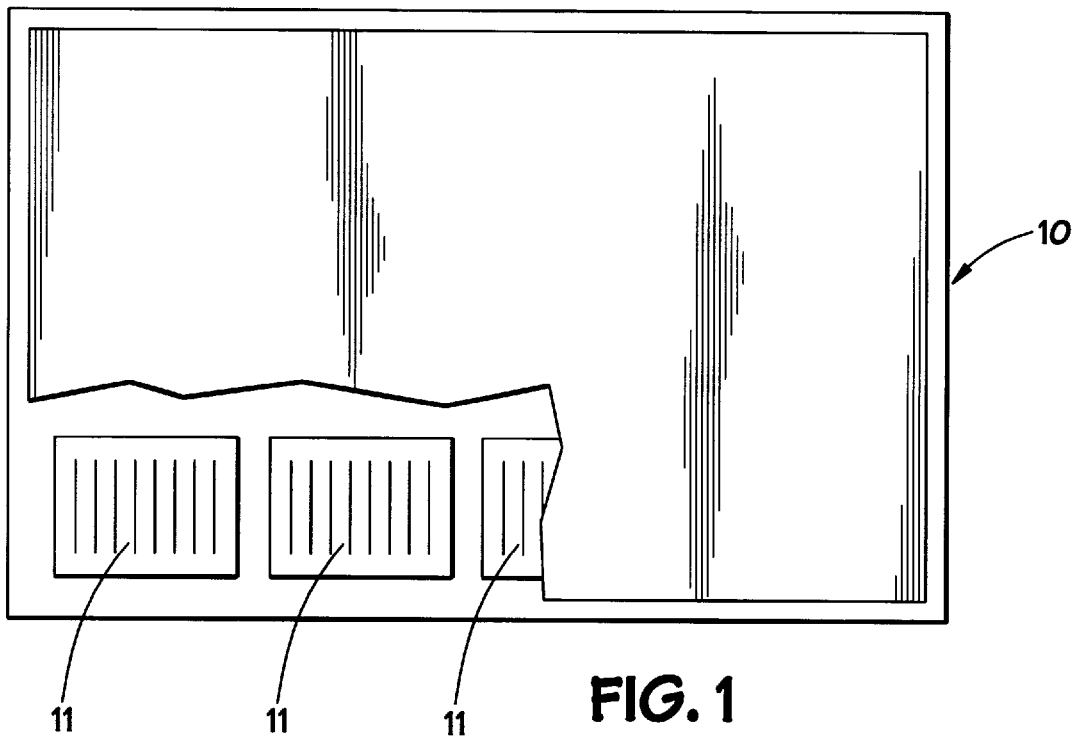
FIG. 1 is a top plan view of a memory device having a plurality of memory arrays in accordance with the present invention.

Memory devices are integrated circuit (IC) devices that include built-in memory storage. Memory device 10, illustrated in FIG. 1, includes a plurality of memory cell arrays 11. As illustrated in FIG. 2, each cell array 11 (also called a memory core) includes a plurality of memory cells 20 addressable by access lines. In one preferred implementation, the memory cells may be arranged to share connections in generally perpendicular rows (word lines) and columns (bit lines). Each cell 20 can be accessed for reading or writing by a corresponding access or isolation device (shown in FIG. 3) by selecting the corresponding row and column coordinates. In accordance with the present invention, each cell includes a multi-state element. In a presently preferred implementation, this multi-state element is a chalcogenide element having a plurality of resistance states achievable by electrical programming of the element.

Figure 3:
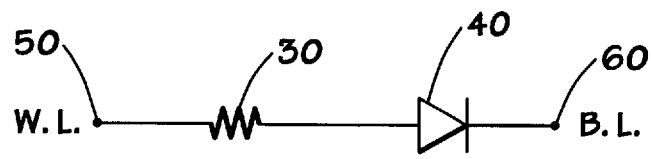
FIG. 3 is an electrical schematic diagram representing a memory cell including a resistive element coupled to a corresponding access device.

The schematic of FIG. 3 represents how each memory cell 20 includes a resistive chalcogenide element 30 and an access or isolation device 40 coupled to the resistive chalcogenide element 30. In the embodiment shown, the access device 40 is a diode. As will be apparent to those skilled in the art, access device 40 serves to isolate the resistive element 30, until it is appropriately addressed through the word and bit lines to read or write the resistive element. Other devices, such as transistors or diode pairs could, of course, also be utilized. Each cell 20 is coupled in series between a word line 50 and a bit line 60. Each cell 20 can be programmed by changing the value of the resistive element 30 by electrical stimulation.

Figure 4:
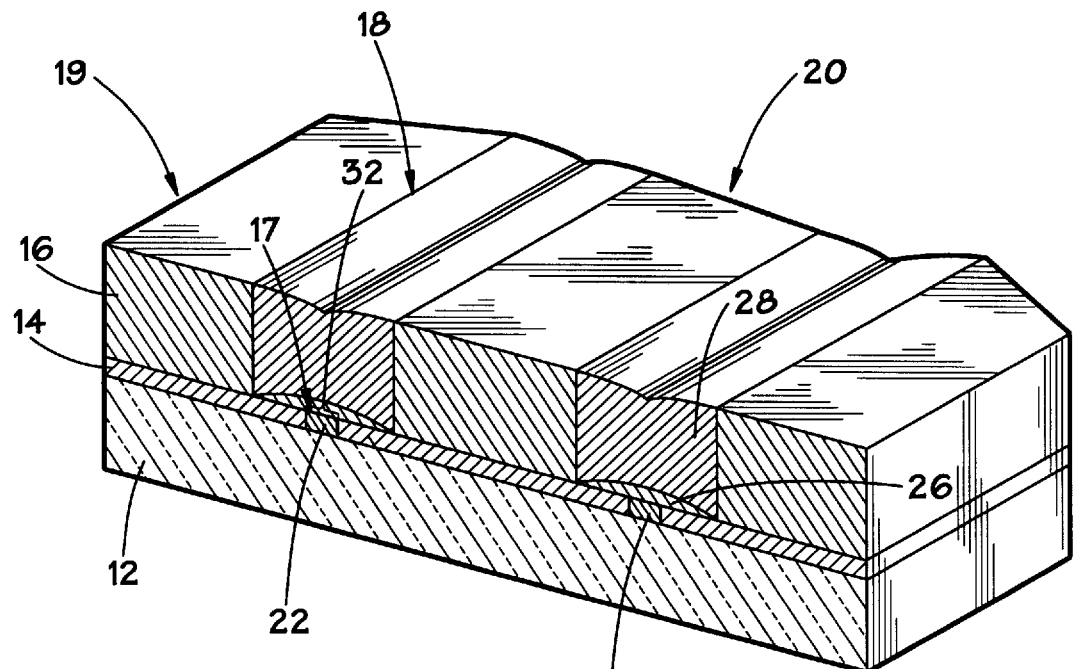
FIG. 4 is a partial isometric view of a cross-sectional cut along line 4—4 of the RAM cell array of FIG. 2.

FIG. 4 illustrates a partial isometric view of an exemplary cell 20 of array 11 of FIG. 2. The cell array 11 includes a base underlayer 12 having elements utilized to complete the integrated circuit, such as the access device diodes and circuit lines. Although lined as a solid element, a plurality of structures may be formed on a substrate to form the remainder of the memory cell and related structures. In this embodiment, directly above the base underlayer 12 is a relatively thin passivation layer 14. A relatively thick protective/insulative layer 16, of a dielectric material such as boron and phosphorous doped silicon dioxide glass (BPSG), is formed into long strips over the passivation layer 14, forming long trenches 18. The trenches 18 have a first recessed dielectric surface 17 at the level of the passivation layer 14 and a second higher level dielectric surface 19 at the top of the protective layer strips 16.

A plurality of bottom electrodes 22 are placed at selected spaced locations along the trenches 18. The electrodes 22 electrically couple to the underlayer 12 and provide electrical contact areas 24 (shown in FIG. 5) for making electrical contact to a chalcogenide memory layer 26 (other multi-state materials which exhibit discrete active areas could also be used as the memory layer). The chalcogenide memory layer 26 extends as an unbroken continuous layer along the bottom of each trench 18 over the first dielectric surface 17.

An electrode material layer 28 (a conductive layer) extends over the chalcogenide memory layer 24, filling up the trenches 18 completely. The electrode material layer 28 will preferably be selected to be non-contaminative with the chosen chalcogenide material. Alternatively, the electrode material layer can include a diffusion barrier material which may be utilized to prevent contamination or other disruption of the chalcogenide material. Accordingly, the electrode material layer 28 can comprise more than one layer, such as a first diffusion layer and one (or more) conductive layers serving as the electrode. Suitable materials for the electrode layer will typically include conductive metals and/or alloys, such as, for example, tungsten, titanium nitride, carbon and molybdenum.

It has been observed that during programming and use, the chalcogenide layer 26 will have discrete active areas 32 of a limited dimension surrounded by areas of generally permanently low resistance chalcogenide. The active areas 32 act as a non-volatile resistive memory elements (the functional equivalent to the resistive element 30 of FIG. 2) of the memory cell 20. The electrode material layer 28 electrically couples the active areas 32.

The size of each active area 32 is to some extent dependent on the dimensions of the contact area 24 of the electrode 22. Minimizing the contact areas 24 will substantially tend to minimize the active area 32. Since the programming rates and programming current are directly related to the size of the active area 32, a smaller active area 32 reduces the time and electrical current required to program the memory cell 20. Moreover, reduced programming current requirements result in reduced cross-talk and therefore in potentially reduced cell-to-cell distance or pitch. Reduced cell-to-cell distance, as well as reduced cell size, facilitate higher cell density and higher memory capacities.

In one presently preferred embodiment the contact area 24 will be formed to have a diameter of 50 nm–100 nm, the passivation layer 14 is formed with a thickness of 50 nm–500 nm, and the trench 18 has a depth of 700 nm and a width of 500 nm.

Figure 2:
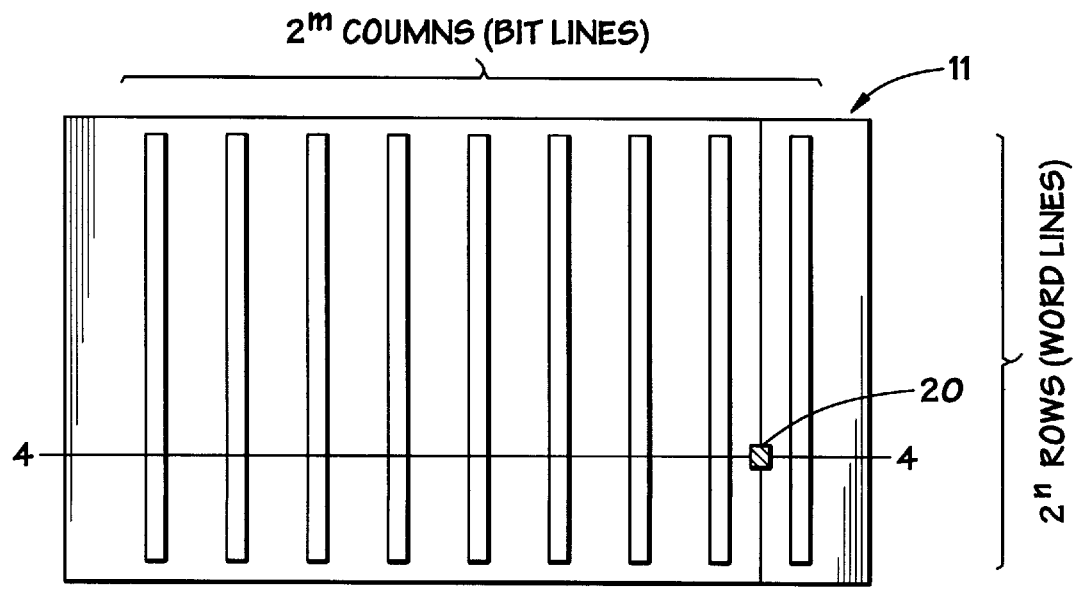
FIG. 2 is a top plan view of a portion of one of the memory arrays of the memory device of FIG. 1, the memory array including a memory cell.

A preferred method to manufacture the cell array 11 shown in FIGS. 1 and 2 is to begin by forming the underlayer 12, including the electrodes 22. Fabrication of underlayer 12 can be accomplished by silicon manufacturing methods generally known in the art. Passivation layer 14 is applied to the underlayer 12, preferably by deposition. The electrodes can be placed in the passivation layer 14 by lithography/CVD or other existing techniques. Typically, the objective will be to form a small contact area electrically coupled to one or more element within underlayer 12.

Figure 5:
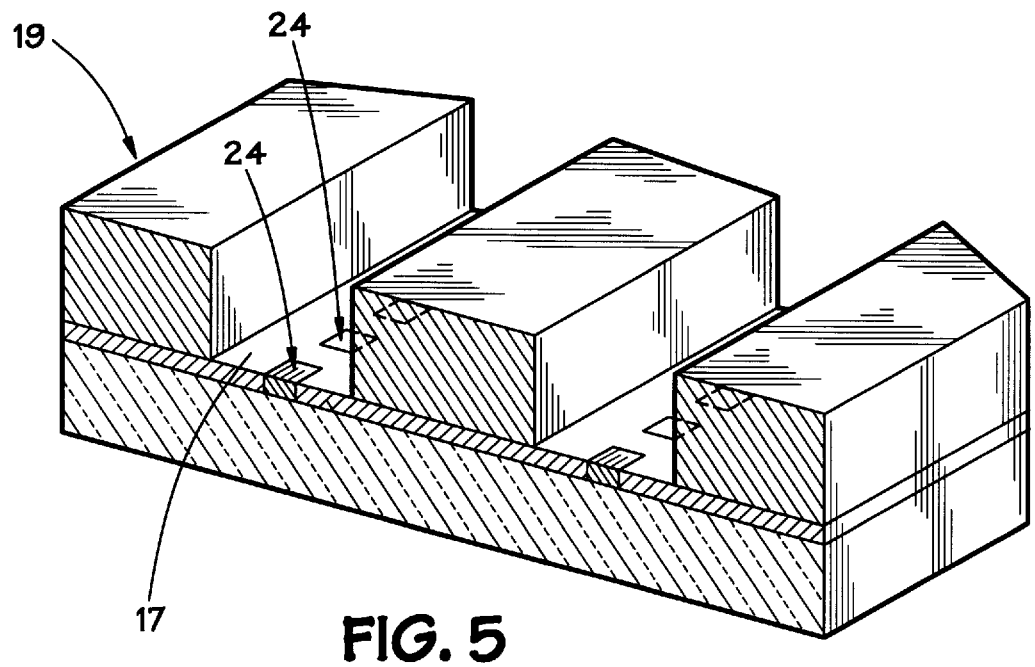
FIG. 5 is a partial isometric view of the memory cell array of FIG. 2 at a post oxide etch step of manufacture.

The thick protective layer 16 is applied (again, preferably by deposition) over the passivation layer 14. Together, the thick protective layer 16 and the passivation layer 14 create a dielectric volume. A preferred method of forming the trenches 18 is to print a photo-resist pattern on the protective layer 16, with exposed areas of no resist matching the intended location of the trenches 18 over the electrode contact areas 24. An anisotropic oxide etch is then used to remove the exposed areas of the protective layer 16, creating trenches 18 and leaving the contact areas 24 exposed as shown in FIG. 5. After the etching of the trenches 18, the photo-resist pattern is removed.

After appropriately preparing the contact areas 24 as necessary, the chalcogenide memory layer 26 is applied onto a bottom surface of the trenches 18. In a preferred embodiment, the chalcogenide memory layer 26 is sputtered and has a thickness of about 50 nm. Because of the poor step coverage of the sputtering technique, the sidewalls of the trench are not covered or are minimally covered. This will leave a continuous layer of chalcogenide extending over a plurality of electrodes.

Next, the upper electrode material layer 28 is applied on top of the chalcogenide memory layer 26, preferably by chemical vapor deposition (CVD), filling the trench 18 completely. As mentioned above, the electrode material layer 28 can include a first diffusion barrier/sub-layer and several other conductive sub-layers deposited consecutively. The different conductive sub-layers can electrically couple to different active areas 32. Any surplus electrode material or chalcogenide deposited on top of the protective layer 16 is preferably etched back, to insure separation of the trenches 18. Each filled trench 18 then becomes a low resistance buss, such as an access line, for the memory cell array 11. Additionally, the electrode material layer 28 encases the chalcogenide layer 26 in a protective envelope that prevents contamination or damage from subsequent fabrication or handling processes.

Figure 6:
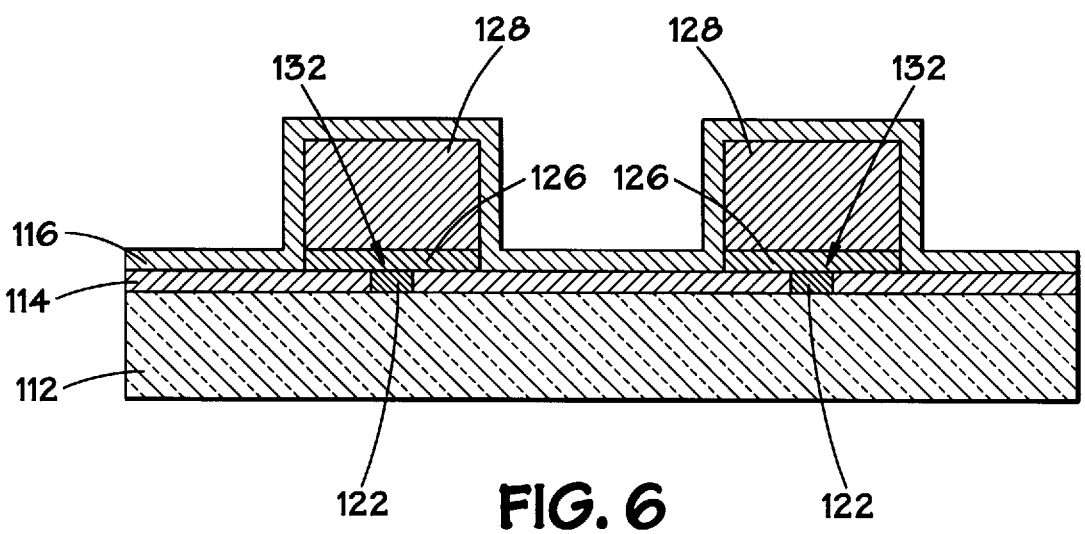
FIG. 6 is an elevation view of a cross-sectional cut of a memory cell array manufactured in accordance with a post-stacking etch technique of the present invention.

FIG. 6 illustrates a memory cell array manufactured in accordance with an alternative "post-stack etching" method. In this method an underlayer 112 similar to underlayer 12 of the previous embodiment and having regularly spaced electrodes 122 is provided. As before, a passivation layer 114 is deposited over this underlayer 112. However, the next step is to place (by deposition, sputtering or any other similar method) a thin chalcogenide layer 126 over the entire surface of the passivation layer 114. An electrode material layer 128, which can comprise one or more conductive (e.g., metal) and diffusion layers, is then deposited over the chalcogenide layer 126, forming a multi-layer stack. Then, the whole stack is patterned and etched as needed into word line and memory array patterns. As depicted in FIG. 6, this line of each electrode layer 128 and chalcogenide layer 126 will extend perpendicularly to the plane of illustration. Finally, a second passivation/protection layer 116 is deposited over the etched patterns to protect the memory array during handling.

The post-stack etch method allows the fabrication of a memory array with minimal fabrication steps, while still protecting the chalcogenide material. An upper portion of the electrode layer 128 serves as a conductive path for large currents, while also serving as an electrode to the chalcogenide layer. Generally, the portion of the chalcogenide above each electrode 122 becomes an active area 132, acting as a non-volatile memory element.

Figure 7:
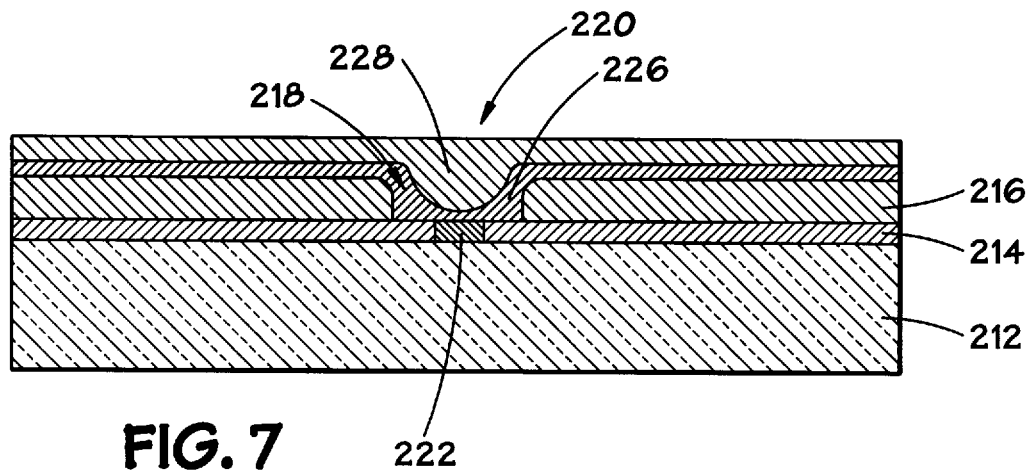
FIG. 7 is an elevation view of a cross-sectional cut of a chalcogenide memory cell manufactured in accordance with the via fill method of the present invention.

FIG. 7 is a side view of a cross-sectional cut of another type of a chalcogenide memory cell 220 manufactured using a "via fill" method. The cell 220 is one of many similar regularly spaced cells in a memory cell array.

Memory cell 220 includes an underlayer 212. Directly over the underlayer 212 is a passivation layer 214. A dielectric protective layer 216 covers the passivation layer 214. A cell opening or via 218 is etched through the protective layer 216. The via 218 can be part of a trench or can be one of a distributed array of individual openings. A chalcogenide layer 226 covers both the protective layer 216 and the via 218. An electrode material layer 228 in turn covers the chalcogenide layer 226. The electrode material layer 228 can comprise a first conductive layer acting as a diffusion barrier and one or more additional conductive layers. An electrode 222 is located at the bottom of the opening 218 on the passivation layer 214. The electrode 222 electrically couples the underlayer 212 and the chalcogenide layer 226.

To manufacture memory cell 220, the first step is to provide underlayer 212. Underlayer 212 can be manufactured by silicon device manufacturing methods known in the art. The passivation layer 214 is then applied, preferably by deposition, over the underlayer 212, with the electrodes 222 placed in a grid pattern at selected spaced locations. Next, the protective layer 216 is applied and formed, preferably deposited and etched, to form the via 218.

A micropore can be used to minimize the contact area 224 of electrode 222 and thus minimize the active area 232 of the chalcogenide layer 226 where desired. If the via 218 can be formed to have a sufficiently small dimension (for example, preferably about 100 nm or less), a micropore will not be necessary for many applications.

Finally, the chalcogenide layer 226 and the electrode layer 228 are successively applied over the structure. If desired, the whole stack of chalcogenide and electrode layers can be patterned and etched. In a preferred embodiment, the chalcogenide layer 226 is sputtered, leaving vertical surfaces of the via 218 substantially free of chalcogenide, thus assuring a reliable bond between the electrode layer 228 and side walls of the via 218. Deposition of electrode layer 228 over at least a plurality of cells seals the covered portion of the chalcogenide layer 226 free from contamination. Once again, a diffusion barrier layer may be placed between the chalcogenide layer 226 and the electrode layer 228. While deposited as a continuous layer, the chalcogenide will be removed to the extent necessary to avoid shorting between the access lines of electrode layer 228, while such access lines will extend over a plurality of electrodes 222, and therefore of the memory cells.

Figure 8:
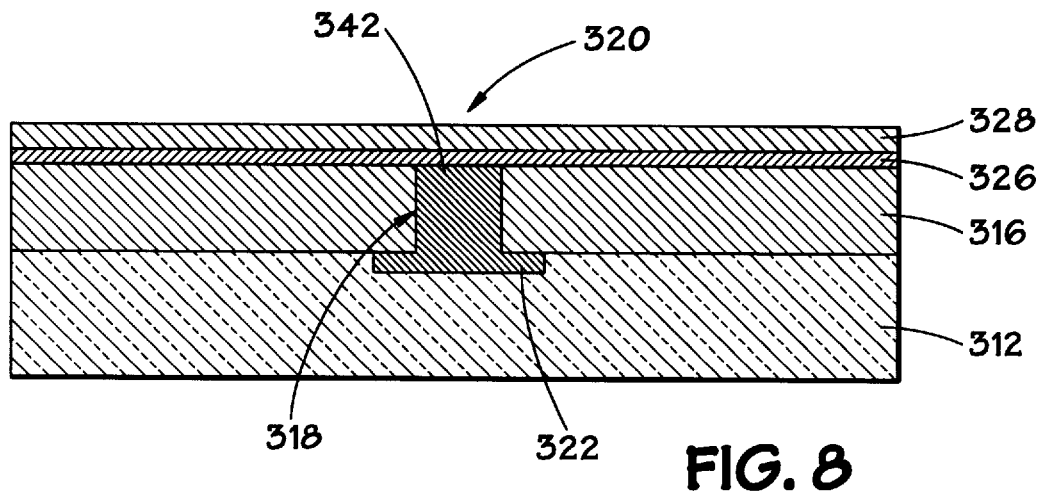
FIG. 8 is an elevation view of a cross-sectional cut of a chalcogenide memory cell manufactured in accordance with the plug fill method of the present invention.

FIG. 8 illustrates a cross-sectional cut of another type of chalcogenide memory cell 320 manufactured in accordance with a "plug fill" method. The main difference between the memory cell 320 of FIG. 8 and the memory cell 220 of FIG. 7 is the use of a "plug" 342 to couple an underlayer 312 with a chalcogenide layer 326. The plug 342 is preferably tungsten or another conductive material that can be deposited using chemical vapor deposition. The plug 342 is deposited flush into an opening 318 etched on a protective layer 316. The plug 342 and the protective layer 316 are both covered, first by a thin chalcogenide layer 326 and then by a thicker electrode material layer 328. In a preferred implementation, the chalcogenide layers will be applied by sputtering. As an exemplary embodiment, plug 342 may be configured to be approximately 100 nm in width and 300 nm in height.

The plug 342 will typically interface with a relatively larger conductor 322 in the underlayer 312. The conductor 322 can either be a portion of the elements forming the underlayer 322 (that is, elements of an access device such as diodes or transistors) or may be electrically coupled to them.

Figure 9:
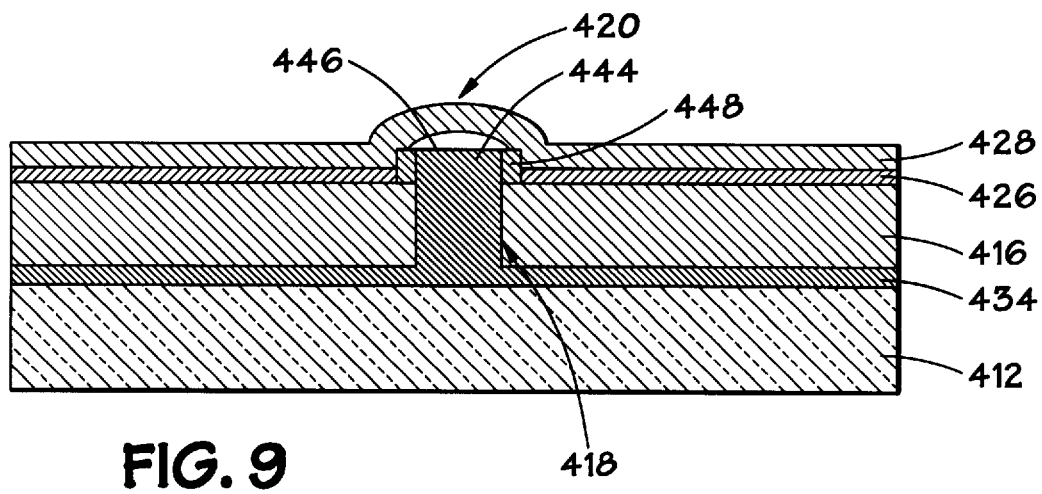
FIG. 9 is a side view of a cross-sectional cut of a chalcogenide memory cell manufactured in accordance with the pillar method of the present invention.

For certain applications it can be advantageous to be able to deposit the chalcogenide as a continuous layer, but to have isolated areas of chalcogenide material. FIG. 9 is a side view of a cross-sectional cut of a "pillar" topology chalcogenide memory cell 420. As with other embodiments, the first step in the manufacture of memory cell 420 is to provide an underlayer 412. The underlayer 412 includes access device elements (e.g., diodes, bipolar transistors).

A thin lower electrode material layer 434, generally a metal layer, is applied, generally by deposition, over the underlayer 412. Next, a protective layer 416 (of a material such as BPSG) is applied and formed over the electrode material layer 434. At this stage, the protective layer 416 is several tenths of a micrometer thicker than its final intended thickness. An array of cell openings 418 are made into the protective layer 416.

In a preferred embodiment, the layers 434 and 416 are deposited, and a cell opening 418 is etched in layer 416 in a conventional manner. Pillar 444 is then formed inside of an etched cell opening 418 using CVD. Acceptable materials for this pillar 444 are tungsten or other CVD compatible conductive materials. Once pillar 444 is formed, the protective layer 416 is selectively etched to its final intended thickness, lowering the sidewalls of the cell opening 418 and leaving pillar 444 with a protruding portion 446 extending above a top surface of the protective layer 416. A coating of a spacer material, such as silicon dioxide or silicon nitride, is deposited over the protective layer 416 and etched back to form side spacers 448 surrounding the sides of the protruding portion 446 of pillar 444, thereby providing an insulative barrier therearound.

A chalcogenide layer 426 may then be deposited above the protective layer 416, the side spacers 448, and a top surface of the protruding portion 446. A preferred method of deposition is sputtering, which leaves vertical surfaces with little or no chalcogenide covering. Thus, a relatively isolated active chalcogenide area 432 is created on the top surface of pillar 444, without the need to etch exposed chalcogenide. The side spacers 448 eliminate lateral cross-talk and physically limit the active area. An upper electrode material layer 428 is deposited immediately after the sputtering process, covering and protecting the chalcogenide layer 426. Electrode material layer 428 can include a metal layer and a diffusion barrier (e.g., titanium nitride). This layer will be either etched, or formed initially, to define electrode lines, which may serve as word lines. Because the non-active portion of chalcogenide layer 426 (i.e., generally that part not above pillar 444) should not extend across multiple electrode lines, the chalcogenide material should be etched or otherwise removed from extending between these lines to avoid shorting between the lines.

For the embodiments shown, a preferred ratio between the diameter of the active area and the cell to cell distance is currently preferably between 5:1 and 10:1, thus minimizing cross-talk. Any thermal or electrical disturbances caused by the programming of any one active area are conducted away by the electrode material layer acting as a low resistance buss. The use of a single contiguous chalcogenide layer increases manufacturing efficiency by eliminating segmentation masking and etching steps.

It should be readily understood that the embodiments described and illustrated herein are illustrative only, and are not be considered as limitations upon the scope of the present invention. Other variations and modifications may be made in accordance with the spirit and scope of the present invention.

What is claimed is:

1. A memory array having a plurality of memory cells, at least a portion of said memory array comprising:

a substrate;

a dielectric layer disposed on said substrate;

a plurality of individual conductive members being formed in said dielectric layer and being coupled to said substrate, said plurality of individual conductive members being arranged in rows;

a plurality of strips of multi-state material, one respective strip of multi-state material disposed on each of the respective rows of said plurality of individual conductive members; and a plurality of strips of conductive material, one respective strip of conductive material disposed on each respective strip of multi-state material.

2. The memory array, as set forth in claim 1, wherein said substrate comprises a plurality of access devices, each of said plurality of access devices being coupled to a respective one of said plurality of individual conductive members.

3. The memory array, as set forth in claim 1, wherein each of said plurality of individual conductive members has a width smaller than a width of said respective strip of multi-state material.

4. The memory array, as set forth in claim 1, further comprising an insulator being disposed about each stack formed by said respective strips conductive material and said respective strips of multi-state material.

5. The memory array, as set forth in claim 1, wherein a portion of each of said plurality of individual conductive members extends above a top surface of said dielectric layer.

6. The memory array, as set forth in claim 5, further comprising a dielectric spacer disposed about each of said extending portions.

7. The memory array, as set forth in claim 6, wherein each respective strip of multi-state material is disposed on said respective extending portions and said respective dielectric spacers.

8. The memory array, as set forth in claim 1, wherein said multi-state material comprises a phase changing material.

9. The memory array, as set forth in claim 8, wherein said phase changing material comprises a chalcogenide material.

10. A memory array having a plurality of memory cells, at least a portion of said memory array comprising:

a substrate;

a dielectric layer disposed on said substrate;

a plurality of individual conductive members being formed in said dielectric layer, a first end portion of each of said plurality of individual conductive members extending above said dielectric layer and a second end portion of each of said plurality of individual conductive members being coupled to said substrate;

a plurality of dielectric spacers, each of said plurality of dielectric spacers being disposed about a respective first end portion of said plurality of individual conductive members;

a continuous layer of multi-state material disposed on a first plurality of said plurality of individual conductive members; and a continuous layer of conductive material disposed on said continuous layer of multi-state material.

11. The memory array, as set forth in claim 10, wherein said substrate comprises a plurality of access devices, each of said plurality of access devices being coupled to a respective one of said plurality of individual conductive members.

12. The memory array, as set forth in claim 10, wherein said multi-state material comprises a phase changing material.

13. The memory array, as set forth in claim 10, wherein said phase changing material comprises a chalcogenide material.

14. A memory array having a plurality of memory cells, at least a portion of said memory array comprising:

a plurality of individual conductive members being arranged in rows, each of said plurality of individual conductive members having a width;

a plurality of strips of multi-state material, a respective one of said plurality of strips of multi-state material being disposed on a respective one of said rows of said plurality of individual conductive members, each of said plurality of strips of multi-state material having a width greater than the width of said individual conductive members in said respective one of said rows; and a plurality of strips of conductive material, a respective one of said plurality of strips of conductive material being disposed on a respective one of said plurality of strips of multi-state material.

15. The memory array, as set forth in claim 14, wherein said substrate comprises a plurality of access devices, each of said plurality of access devices being coupled to a respective one of said plurality of individual conductive members.

16. The memory array, as set forth in claim 14, further comprising an insulator being disposed about each stack formed by said respective strips conductive material and said respective strips of multi-state material.

17. The memory array, as set forth in claim 14, wherein a portion of each of said plurality of individual conductive members extends above a top surface of a dielectric layer.

18. The memory array, as set forth in claim 17, further comprising a dielectric spacer disposed about each of said extending portions.

19. The memory array, as set forth in claim 18, wherein each respective strip of multi-state material is disposed on said respective extending portions and said respective dielectric spacers.

20. The memory array, as set forth in claim 14, wherein said multi-state material comprises a phase changing material.

21. The memory array, as set forth in claim 20, wherein said phase changing material comprises a chalcogenide material.

* * * * *